(12) United States Patent
Doris et al.

(10) Patent No.: US 7,285,826 B2
(45) Date of Patent: Oct. 23, 2007

(54) HIGH MOBILITY CMOS CIRCUITS

(75) Inventors: Bruce B. Doris, Brewster, NY (US); Oleg G. Gluschenkov, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/244,291

(22) Filed: Oct. 6, 2005

(65) Prior Publication Data
US 2006/0027868 A1   Feb. 9, 2006

Related U.S. Application Data

(63) Continuation of application No. 10/701,526, filed on Nov. 6, 2003, now Pat. No. 7,015,082.

(51) Int. Cl.
*H01L 27/01* (2006.01)
*H01L 27/12* (2006.01)
*H01L 31/0392* (2006.01)
*H01L 29/76* (2006.01)

(52) U.S. Cl. ............... 257/351; 257/368; 257/369; 257/635; 257/637; 438/153; 438/157; 438/197

(58) Field of Classification Search ............ 257/351, 257/368, 369, 635, 637, 639; 438/153, 157, 438/197
See application file for complete search history.

(56) References Cited

U.S. PATENT DOCUMENTS 3,602,841 A   8/1971   McGroddy

| | | |
|---|---|---|
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke |

(Continued)

FOREIGN PATENT DOCUMENTS

JP   64-76755   3/1989

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

(Continued)

*Primary Examiner*—Sara Crane
*Assistant Examiner*—Samuel A. Gebremariam
(74) *Attorney, Agent, or Firm*—Joseph P. Abate; Greenblum & Bernstein, P.L.C.

(57) ABSTRACT

Semiconductor structure formed on a substrate and process of forming the semiconductor. The semiconductor includes a plurality of field effect transistors having a first portion of field effect transistors (FETS) and a second portion of field effect transistors. A first stress layer has a first thickness and is configured to impart a first determined stress to the first portion of the plurality of field effect transistors. A second stress layer has a second thickness and is configured to impart a second determined stress to the second portion of the plurality of field effect transistors.

23 Claims, 14 Drawing Sheets

U.S. PATENT DOCUMENTS

| | | | |
|---|---|---|---|
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Dishi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,235,574 B1 * | 5/2001 | Tobben et al. | 438/241 |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | Von Ehrenwall | |
| 6,476,462 B2 | 11/2002 | Shimizu et al. | |
| 6,483,154 B1 * | 11/2002 | Ngo et al. | 257/384 |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,573,172 B1 * | 6/2003 | En et al. | 438/626 |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0135234 A1 | 7/2004 | Morin et al. |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si—Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kern Rim, et al., "Transconductance Enhancement in Deep Submicron Strained-Si n-MOSFET's", International Electron Devices Meeting, 26, 8, 1, IEEE, Sep. 1998.

Kern Rim, et al., "Characteristics and Device Design of Sub-100 nm Strained Si N- and PMOSFET's", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for High Performance 55nm CMOS", International Electron Devices Meeting, 2.2.1, IEEE, Feb. 2002.

* cited by examiner

HIGH MOBILITY CMOS CIRCUITS

CROSS-REFERENCE TO RELATED APPLICATIONS

The present application is a continuation of U.S. application Ser. No. 10/701,526 filed Nov. 6, 2003 now U.S. Pat. No. 7,015,082, the disclosure of which is expressly incorporated by reference herein in its entirety.

BACKGROUND OF INVENTION

1. Field of the Invention

The invention generally relates to a semiconductor device and method of manufacture and, more particularly, to a complementary metal-oxide-semiconductor (CMOS) device that includes an etch stop layer with a selectively varying thickness.

2. Background of the Invention

As semiconductor devices continue to evolve towards higher densities of circuit elements, the performance of materials used for the devices becomes more critical to overall performance, such as charge carrier mobility. CMOS devices fabricated on substrates having a thin strained silicon (Si) layer on a relaxed SiGe buffer layer exhibit substantially higher electron and hole mobility in strained Si layers than in bulk silicon layers. Furthermore, metal oxide semiconductor field effect transistors (MOSFETs) with strained Si channels exhibit enhanced device performance compared to devices fabricated in conventional (unstrained) silicon substrates. Unfortunately, however, as Ge concentrations increase to a level required to enhance performance of p-channel field effect transistors, so does defect density.

Another approach for achieving performance enhancement involves imparting local mechanical stresses. Electron mobility and, thus, n-channel field effect transistor (nFET) performance may be improved by imparting tensile stress either along (i.e., parallel to) the direction of a current flow and/or orthogonal to the direction of current flow. Additionally, hole mobility and, thus, p-channel field effect transistor (PFET) performance, may be enhanced by imparting compressive stress parallel to the direction of current flow and tensile stress perpendicular to the direction of current flow.

Etch stop films may be applied to impart tensile and compressive stresses. For example, a tensile stress may be imparted to an NFET channel by applying a tensile etch stop film. A compressive stress may be imparted to a pFET channel by applying a compressive etch stop film. However, such an approach has drawbacks. In particular, the compressive film degrades NFET performance, while the tensile film degrades pFET performance.

Furthermore, although etch stop films may be configured to impart significant stresses, relatively thick films are required as the stress transferred is proportional to film thickness. Problematically, as film thickness increases, voids are likely to form in the film. This is especially true in dense structures, such as cache or SRAM cells, where gates are very closely spaced, e.g., at a minimum pitch. During contact etching, such voids may open and fill with contact metal. As the voids run parallel to the gates, the voids filled with contact metal may cause contact shorts, thereby preventing proper circuit functionality.

The invention is directed to overcoming one or more of the problems as set forth above.

SUMMARY OF THE INVENTION

In a first aspect of the invention, a semiconductor structure is provided. The structure includes a plurality of field effect transistors and first and second stress layers deposited on portions of the field effect transistors. The plurality of field effect transistors include a first portion of field effect transistors and a second portion of field effect transistors. A first stress layer has a first thickness and is configured to impart a first determined stress to the first portion of the plurality of field effect transistors. A second stress has a second thickness and is configured to impart a second determined stress to the second portion of the plurality of field effect transistors.

Furthermore, in an exemplary embodiment, areas of the semiconductor that would not experience performance enhancement due to the stress imparted by the first stress layer are devoid of the first stress layer. Likewise, areas of the semiconductor that would not experience performance enhancement due to the stress imparted by the second stress layer are devoid of the second stress layer. The imparted stresses may be compressive and/or tensile. Additionally, the first and second stress layers may have the same or different thicknesses.

In another aspect of the invention a semiconductor structure formed on a substrate includes a first plurality of n-channel field effect transistors having a first range of spacings between adjacent n-channel field effect transistors that fall within a first defined spacing range. The structure also includes a second plurality of n-channel field effect transistors having a second range of spacings between adjacent n-channel field effect transistors that fall within a second defined spacing range. Additionally, the structure includes a first plurality of p-channel field effect transistors having a first range of spacings between adjacent p-channel field effect transistors that fall within a first defined spacing range. Furthermore, the structure includes a second plurality of p-channel field effect transistors having a second range of spacings between adjacent p-channel field effect transistors that fall within a second defined spacing range.

A first tensile layer having a first tensile layer thickness and being configured to impart a first determined tensile stress is applied to the first plurality of n-channel field effect transistors. A second tensile layer having a second tensile layer thickness and being configured to impart a second determined tensile stress is applied to the second plurality of n-channel field effect transistors. A first compressive layer having a first compressive layer thickness and being configured to impart a first determined compressive stress is applied to the first plurality of p-channel field effect transistors. A second compressive layer having a second compressive layer thickness and being configured to impart a second determined compressive stress is applied to the second plurality of p-channel field effect transistors.

In a further aspect of the invention, a process of forming a semiconductor structure is provided. The process entails forming a semiconductor substrate. Next, a plurality of field effect transistors are formed on the semiconductor substrate. The plurality of field effect transistors includes a first portion of field effect transistors and a second portion of field effect transistors. Subsequently, a first stress layer is deposited. The first stress layer has a first thickness and is configured to impart a first determined stress to the first portion of the plurality of field effect transistors. A second stress layer is also deposited. The second stress layer has a second thickness and is configured to impart a second determined stress to the second portion of the plurality of field effect transistors.

Furthermore, in an exemplary implementation, portions of the first stress layer may be removed from areas of the semiconductor that would not experience performance enhancement due to the stress imparted by the first stress layer. Likewise, portions of the second stress layer may be removed from areas of the semiconductor that would not experience performance enhancement due to the stress imparted by the second stress layer. The imparted stresses may be compressive and/or tensile. Additionally, the first and second stress layers may have the same or different thicknesses.

DETAILED DESCRIPTION OF EMBODIMENTS OF THE INVENTION

The invention employs selectively applied thin stressed films, such as tensile films, thin compressive films, and thick tensile films, to enhance electron and hole mobility in CMOS circuits. An exemplary process in accordance with the invention entails steps of applying each film, and patterning for selectively removing the applied film from areas that would not experience performance benefit from the applied stressed film.

Figure 1:
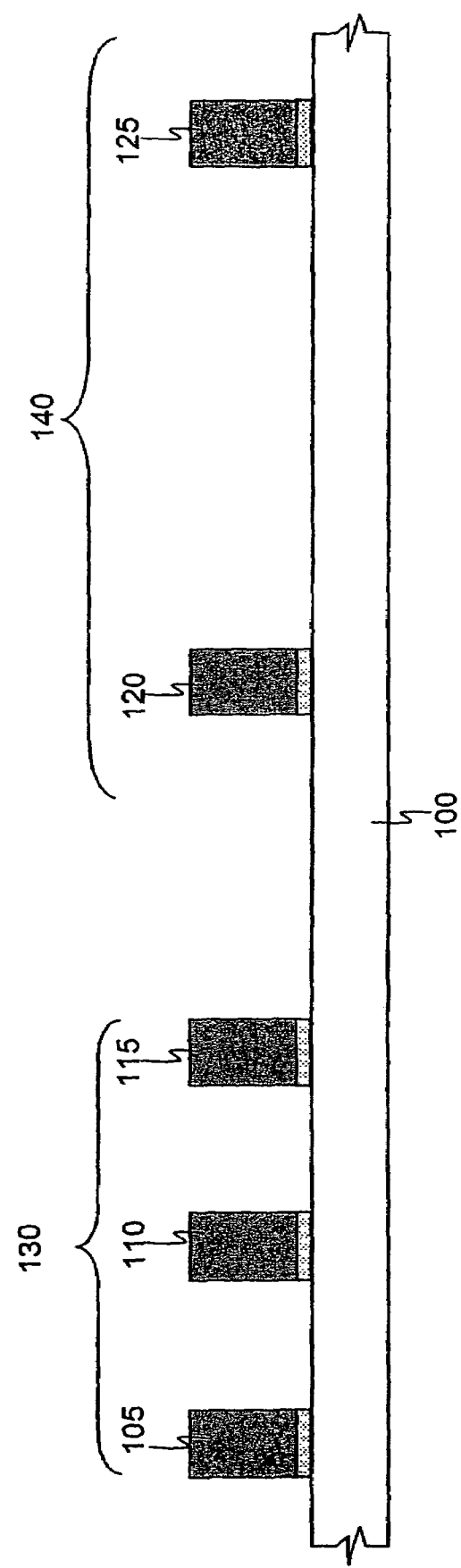
FIG. 1 shows a CMOS device having a plurality of FETS (i.e., NFETS and/or PFETS)

Referring now to FIG. 1, a substrate 100 having a plurality of FETS (i.e., NFETS and/or PFETS) 105-125 is shown. The substrate 100 includes areas of different densities of nFETS and pFETs, including areas of high concentration or density 130 and areas of low concentration or density 140. Typically, similar devices are clustered; though the invention is applicable to devices having nFETs interspersed with pFETs, and vice versa.

The high density area 130 exhibits closely spaced FETs. In such an area, the distance from gate to gate may, for example, be 130 nanometers (nanometers). As used herein, a high density area refers to an area with closely spaced FETs, even if there are only two FETs in the area. The low density or isolated area 140 exhibits FETs with a relatively substantial distance from gate to gate. In such an area, the distance from gate to gate may, for example, be 200 nanometers or greater. The substrate 100, including the FETs 105-125, may be fabricated in a conventional manner. While FIGS. 1 through 14 illustrate principles of exemplary implementations of the invention, they are not drawn to scale. Thus, the dimensions, proportions and spacings of device elements may differ from those depicted in the Figures.

The stress layer influences what is considered a dense or isolated area. A dense area would not be able to accommodate a thick stress layer without a substantial likelihood of void formation. The thicker the layer, the more space it requires to avoid undesirable void formation. Additionally, some stress layer materials and depositing parameters may be more conducive to void formation than others. Conversely, an isolated area is able to accommodate a thick stress layer without a substantial likelihood of void formation. While layer thicknesses and distances between FETs are provided herein for illustrative purposes, those skilled in the art should appreciate that the invention is not limited to the specifically provided thicknesses and distances.

Etch stop films (or layers) applied as stress layers in accordance with the invention may include refractory insulating material or materials with selective etch and physical properties. By way of example, silicon nitride $Si_3N_4$ or $Si_xN_y$, and/or silicon oxynitride $Si_xON_y$, may be used for stress films. These materials may be grown or blanket deposited in a conventional manner, such as by chemical vapor deposition (CVD), plasma enhanced CVD or physical vapor deposition (PVD). Such films can be made with a well controlled thickness. Illustratively, the thickness range may be between 50 to 300 nanometers for a thick film, and 20 to 50 nanometers for a thin film. Etch stop films applied in accordance with the principles of the invention act primarily as stress inducing layers.

Stress in applied films may be controlled in a conventional manner. For example, to control the stress qualities of the film, the deposition pressure and/or plasma power and/or other deposition process parameters may be varied illustratively, without limiting the scope of the invention, to achieve a tensile film exhibiting a tensile stress of approximately 700 MPa, the following CVD parameters may be used: a temperature of approximately 480° C., a pressure of approximately 6.25 Torr, a spacing between the wafer and the electrode of 490 mils, a flow of 300 sccm of 2% dilute $SiH_4$ gas, 15 sccm $NH_3$ gas and 1060 sccm $N_2$ gas using RF power of 340 watts. Likewise, without limiting the scope of the invention, to achieve a compressive film exhibiting a compressive stress of approximately −1400 MPa, the following CVD parameters may be used: a temperature of approximately 480° C., a pressure of approximately 5.75 Torr, a spacing between the wafer and the electrode of 395 mils, a flow of 3000 sccm of 2% dilute $SiH_4$ gas, 15 sccm $NH_3$ gas and 1060 sccm $N_2$ gas using RF power of 900 watts. Adjusting the deposition process parameters allows control over properties of the deposited material, including physical properties such as stress properties.

In accordance with the invention, FETs of different spacings (i.e., densities or concentrations) may have stressed films of different thicknesses. In an exemplary implementation, closely spaced nFETs may have a thin tensile film to enhance electron mobility and, thus, NFET performance, while avoiding formation of undesirable voids. Likewise, closely spaced pFETs may have a thin compressive film to enhance hole mobility and, thus, PFET performance, again while avoiding formation of undesirable voids. Similarly, pFETs closely spaced to nFETs would also have thin stressed films. Furthermore, nFETs having a minimum spacing large enough to avoid void formation when a thick film is applied, may have a thick tensile film, while similarly spaced pFETs may have a thick compressive film. Of course, nFETs and pFETs may each be further divided into more than two categories, with each category exhibiting a range of distances between FETs, and each category capable of accommodating a stressed film layer of a determined thickness without substantial risk of undesirable void formation. A stressed etch stop film of a determined thickness or range of thicknesses will apply to each category.

Figure 2:
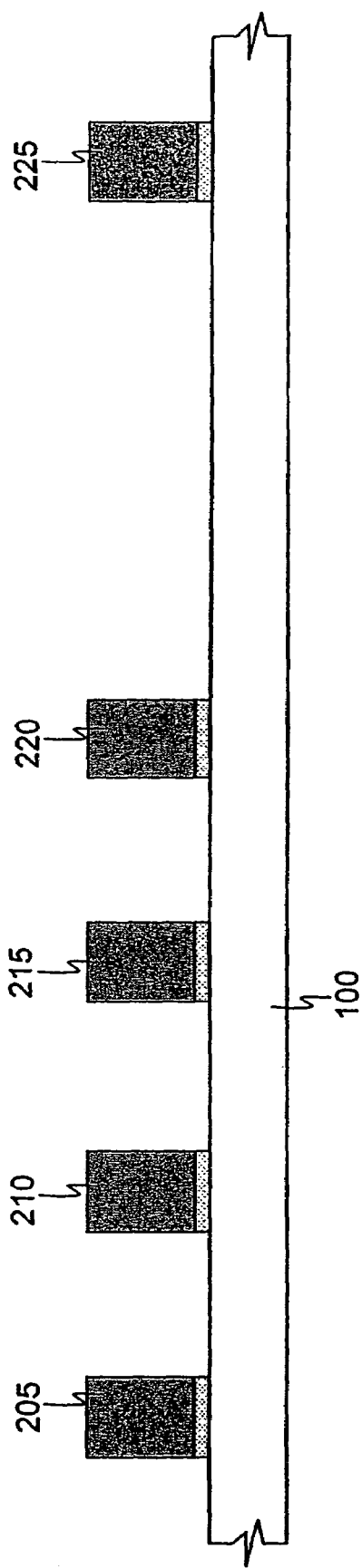
FIG. 2 shows a plurality of FETs, including a dense group of (i.e., a group of closely spaced) nFETs, on a semiconductor device.

In one implementation, nFETs and pFETs may each be divided into two categories, i.e., a dense category of closely spaced FETs 130 and an isolated category of distantly spaced FETs 140, as shown in FIG. 1. Referring now to FIG. 2, a dense group of (i.e., a group of closely spaced) nFETs 205-220 and an isolated FET 225 are shown. In this implementation, the dense group is spaced at about 130 nanometers or less, while the isolated FET 225 may exhibit a spacing of greater than 130 nanometers.

Figure 3:
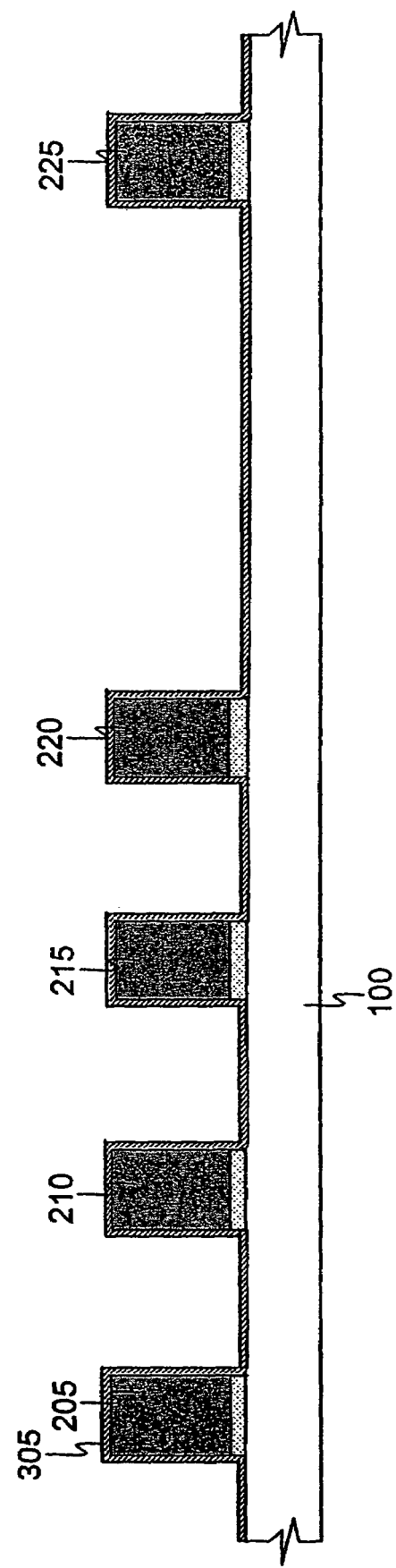
FIG. 3 shows a thin tensile stress layer applied to the plurality of FETs from FIG. 2, including the dense group of nFETs.

To impart a tensile stress to the nFETs 205-220, particularly the channel region of the nFETs 205-220, in accordance with the principles of the invention, a tensile stress layer 305 is applied over the entire surface of the semiconductor device, as shown in FIG. 3 and discussed more fully below. Because the nFETs 205-220 are closely spaced, a thin tensile layer is applied. The applied tensile layer 305 is then removed, such as by masking and etching, from areas of the device that do not benefit from the imparted tensile stress as well as from areas that may benefit from an alternative stress layer, such as the isolated FET 225.

A thin oxide (e.g., $SiO_2$) liner (not shown) may be applied, to serve as an etch stop, before the tensile stress layer 305 is applied. The oxide liner may be approximately 1 to 10 nanometers in thickness. The oxide liner guards against unintended etching of the structure and elements beneath the applied liner and stress layers. Alternatively, a timed etch, such as a timed dry etch, may be used to remove only the applied tensile layer from those areas of the substrate 100 that do not benefit from the imparted tensile stress.

Referring still to FIG. 3, the thin stressed film 305 may be comprised of, for example, $Si_3N_4$. The thin stressed film may also be, for example, $Si_xN_y$, and/or silicon oxynitride $Si_xON_y$. The film 305 may be blanket deposited over the entire surface of the substrate 100 in a conventional manner, such as by CVD, plasma enhanced CVD or PVD. In one implementation, the thin stressed film may have a thickness between 20 to 50 nanometers. The spacing of the closely packed nFETs is about 130 nanometers or less. The film 305 may exhibit a tensile stress of approximately 600 to 1500 MPa (Mega-pascals). The film 305 is thus configured to impart a tensile stress to the underlying areas.

Figure 4:
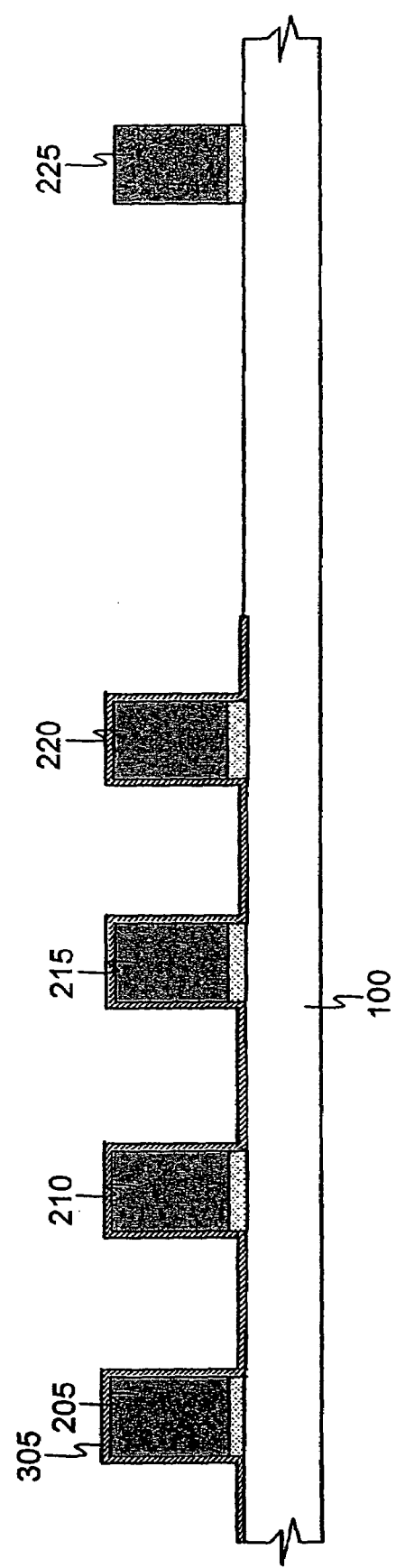
FIG. 4 shows the thin tensile stress layer removed from all areas except the dense group of nFETs.

Next, the thin tensile film 305 is masked on locations where the dense nFETs 205-220 are present, and possibly where isolated nFETs are present, to allow removal from all other areas (e.g., FET 225) of the substrate 100. For example, the desired pattern of nFETs may be transferred to an optical mask, as is well known in the art. The surface of the substrate 100 may then be covered with photoresist. The resist may then be exposed through the mask to radiation that changes its structure, polymerizing (i.e., cross linking) determined areas. Unpolymerzied regions may then be removed using a solvent, leaving the polymerized portions in tact. Subsequent process steps (e.g., etching) will affect only the areas without polymerized photoresist. Thus, the thin tensile film may be removed by etching (e.g., by reactive ion etching using the patterned photoresist as a mask) from all areas (e.g., FET 225) except where the patterned nFETs (e.g., nFETs 205-220) are present, as shown in FIG. 4. Subsequently, any remaining polymerized photoresist may be removed using a wet process, such as sulfuric acid, or a dry process, such as $O_2$ plasma.

Figure 5:
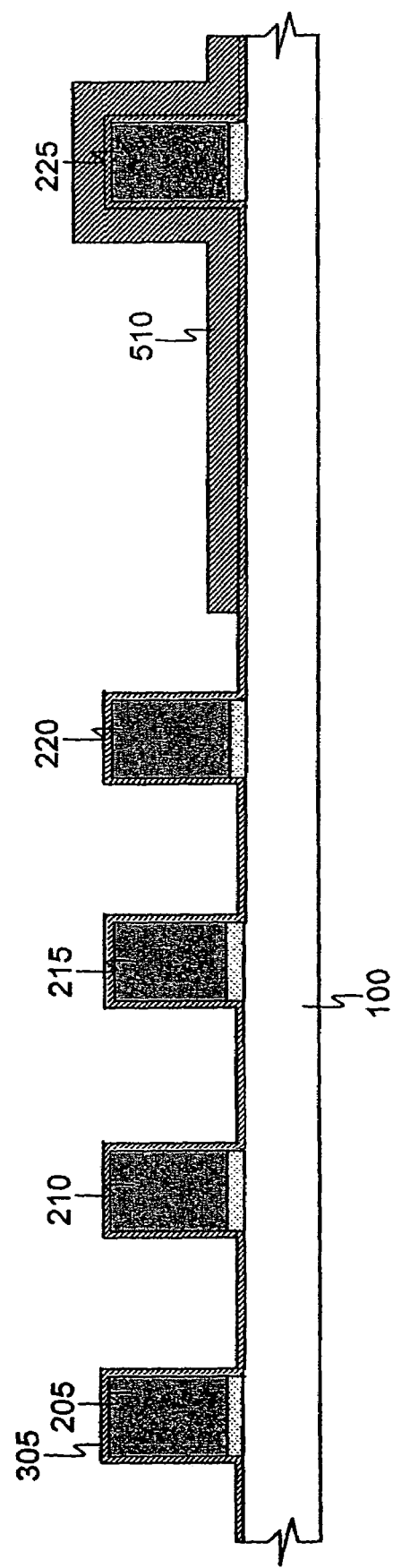
FIG. 5 shows the thin tensile stress layer on a dense group of nFETs and an isolated NFET, and a thick tensile layer on the isolated NFET.

As discussed above, the thin tensile layer 305 may be left on isolated NFETS as shown in FIG. 5. Additional thin (e.g., 20 to 50 nanometers) tensile layers and/or a thick (e.g., 50 to 500 nanometers) tensile layer 510 may subsequently be added to the isolated nFETs, such as in a manner described more fully below, to impart greater tensile stress and thereby achieve further enhancement of electron mobility. Alternatively, the thin tensile layer 305 may be removed from the isolated NFETS; in which case, the isolated nFETs may subsequently receive a thick (e.g., 50 to 500 nanometers) tensile layer to enhance electron mobility, as discussed more fully below. Similarly, thin and thick compressive stress layers may be applied to isolated pFETs, as discussed more fully below.

Subsequently, another oxide liner layer (not shown) may be deposited over the top surface of the entire device to serve as an etch stop, before the next stress layer is applied, as discussed below. The oxide liner guards against unintended etching of elements beneath it, including thin tensile stress layer 305. Alternatively, a timed etch, such as a timed dry etch, may be used to remove only the next layer from those areas of the substrate 100 that do not benefit from the imparted stress.

Figure 6:
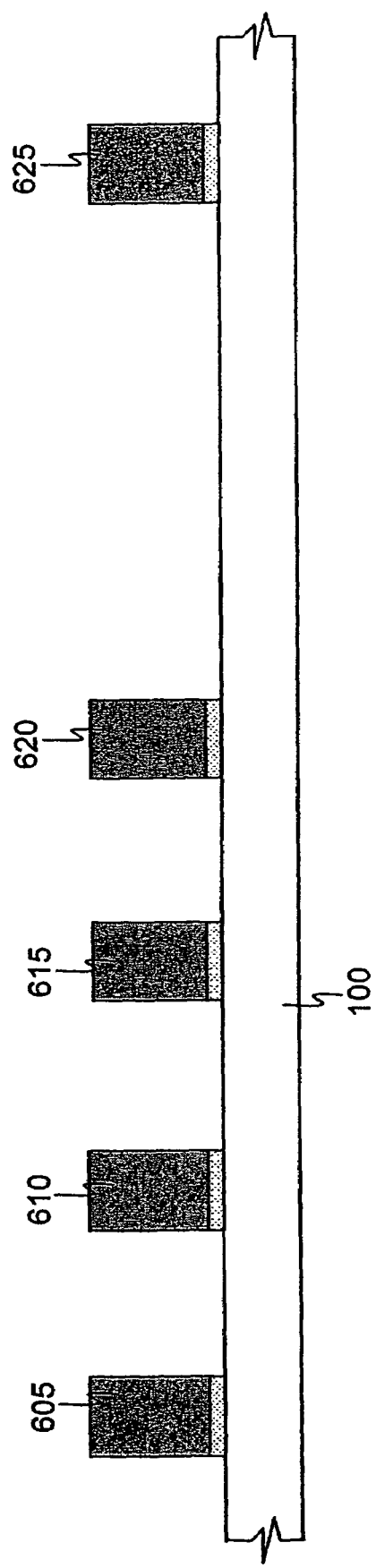
FIG. 6 shows a plurality of FETs, including a dense group of (i.e., a group of closely spaced) pFETs, on a semiconductor device.
Figure 7:
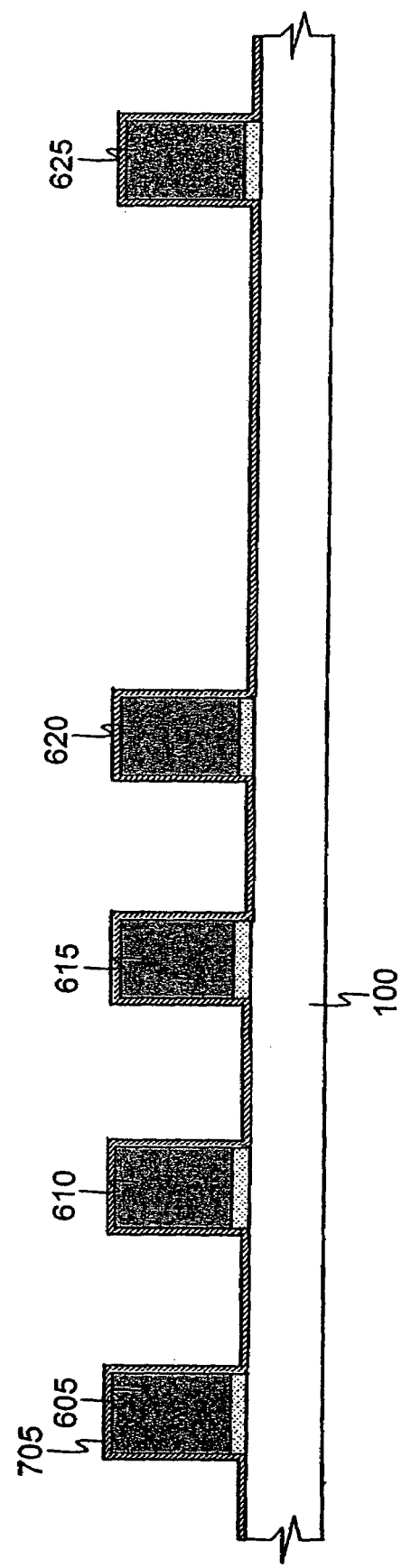
FIG. 7 shows a thin compressive stress layer applied to the plurality of FETs from FIG. 5, including the dense group of pFETs.

Referring now to FIG. 6, a dense group of (i.e., a group of closely spaced) pFETs 605-620 and an isolated FET 625 are shown. In one implementation, the dense group of pFETs 605-620 is spaced at about 130 nanometers or less. To impart a compressive stress to the dense group of pFETs 605-620, particularly the channel region of the pFETs 605-620, in accordance with the principles of the invention, a thin compressive stress layer 705 is applied to the surface of the entire device, as shown in FIG. 7.

The thin compressive layer 705 may be comprised of, for example, $Si_3N_4$. Alternatively, the thin compressive film may be $Si_xN_y$, and/or silicon oxynitride $Si_xON_y$. The film 705 may be blanket deposited over the entire surface of the substrate 100 in a conventional manner, such as by CVD, plasma enhanced CVD or PVD. In one implementation, the thin compressive film may have a thickness between 20 to 50 nanometers. The thin compressive film 705 may exhibit a compressive stress of approximately −600 to −1500 MPa (Mega-pascals). The film 705 is thus configured to impart a compressive stress to underlying areas.

Figure 8:
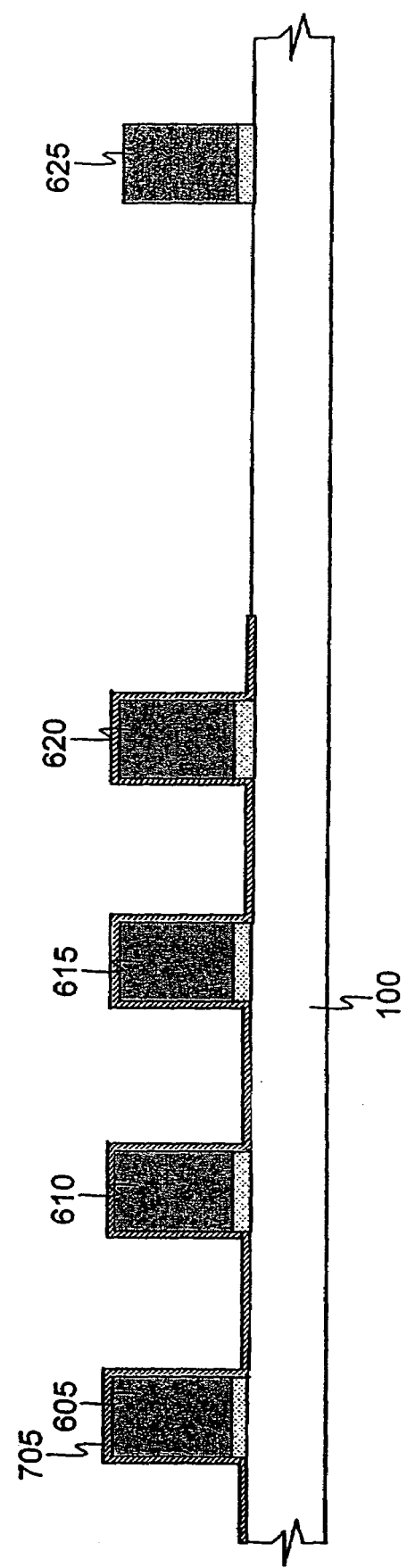
FIG. 8 shows the thin compressive stress layer removed from all areas except the dense group of pFETs.

Next, the thin compressive film 705 may be masked on locations where the dense pFETs 605-620 are present, and possibly where isolated pFETs are present, to allow removal from all other areas of the substrate 100. For example, the desired pattern of pFETs may be transferred to an optical mask in a conventional manner. The surface of the substrate 100 may then be covered with photoresist. The resist may then be exposed through the mask to radiation that changes its structure, polymerizing (i.e., cross linking) determined areas. Unpolymerzied regions may then be removed using a solvent, leaving the polymerized portions in tact. Subsequent process steps (e.g., etching) will affect only the areas without polymerized photoresist. Thus, the thin compressive film 705 may be removed by etching (e.g., by reactive ion etching using the patterned photoresist as a mask) from all areas (e.g., FET 625) except where the patterned pFETs (e.g., nFETs 605-620) are present, as shown in FIG. 8. Subsequently, the polymerized photoresist may be removed using a wet process, such as sulfuric acid, or a dry process, such as $O_2$ plasma.

As discussed above, the thin compressive layer 705 may be left on isolated pFETS. Additional thin (e.g., 20 to 50 nanometers) compressive layers and/or a thick (e.g., 50 to 500 nanometers) compressive layer may subsequently be added to isolated pFETs in a manner described above to impart greater compressive stress (e.g., −600 to −1500 MPa) and thereby achieve further enhancement of hole mobility. Alternatively, the thin compressive layer 705 may be removed from the isolated pFETS 625 as shown in FIG. 8; in which case, the isolated pFETs 625 may subsequently receive a thick compressive layer to enhance hole mobility, as discussed more fully below.

Subsequently, another oxide liner layer (not shown) may be deposited over the top surface of the entire device to serve as an etch stop, before the next stress layer is applied, as discussed below. The oxide liner thus guards against unintended etching of elements beneath it, including thin compressive stress layer 705. Alternatively, a timed etch, such as a timed dry etch, may be used to remove only the next layer from those areas of the substrate 100 that do not benefit from the stress imparted by the next layer.

Figure 9:
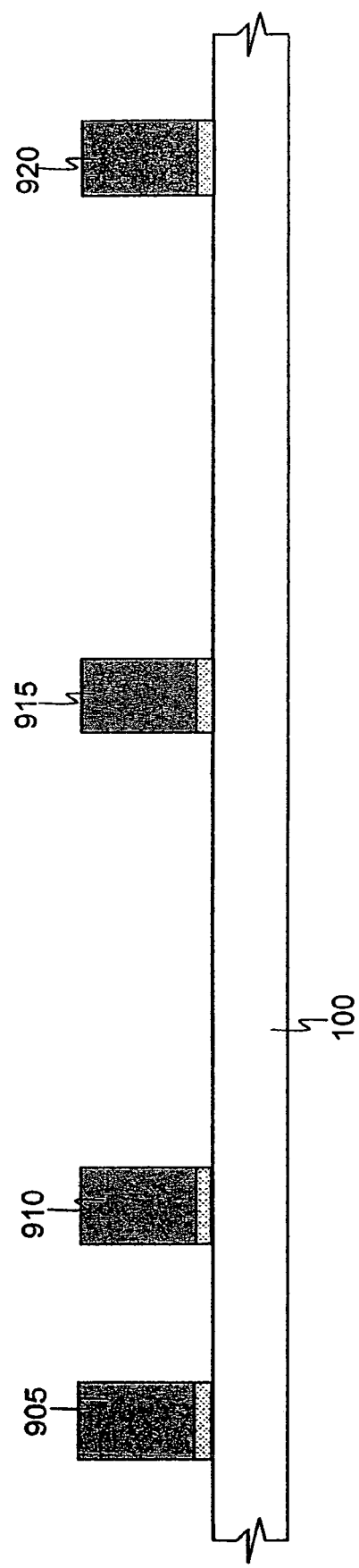
FIG. 9 shows a plurality of FETs, including a group of distantly spaced nFETs, on a semiconductor device.
Figure 10:
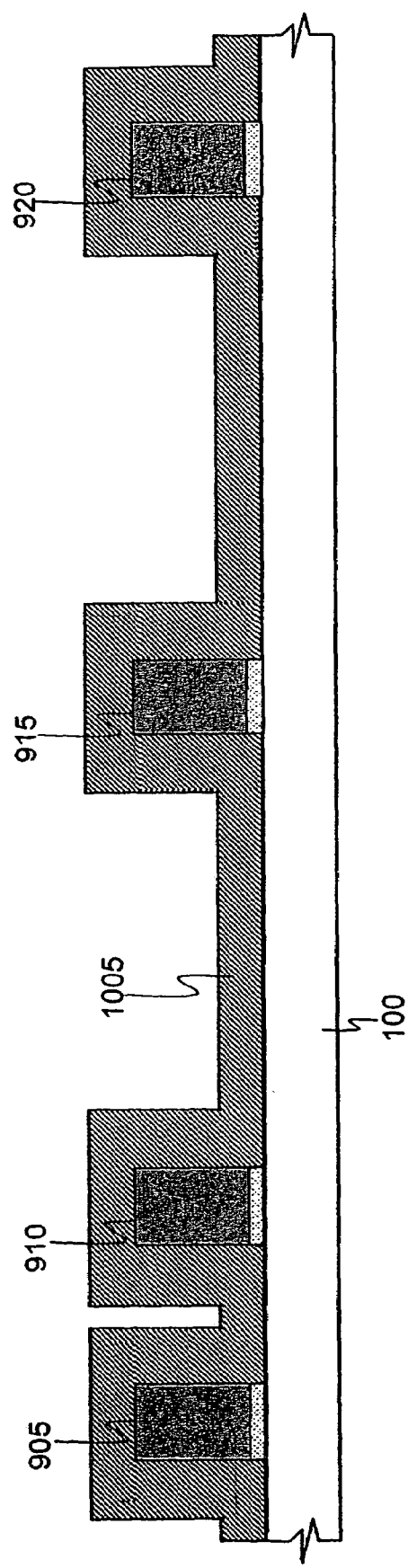
FIG. 10 shows a thick tensile stress layer applied to the plurality of FETs from FIG. 9, including the group of distantly spaced nFETs.

Referring now to FIG. 9, a sparsely populated group of (i.e., a group of distantly spaced) nFETs 915, 920 and a dense group of FETs 905, 910 are shown. The sparsely populated group of nFETs is spaced at about 130 nanometers or greater. To impart a tensile stress to the nFETs 915, 920, particularly the channel region of the nFETs 915, 920, in accordance with the principles of the invention, a tensile stress layer 1005 is applied to the surface of the entire substrate 100, as shown in FIG. 10. Because the nFETs 915, 920 are separated by a relatively substantial distance, a thick stress layer 1005 may be applied without substantial risk of void formation. Those skilled in the art will appreciate that, depending upon the order in which stress layers are added, and depending upon the type of FETs, FETs 905 and 910 may have stress layer (not shown in FIG. 10) beneath layer 1005. Alternatively, a stress layer suitable for FETs 905 and 910 may be added after stress layer 1005 is added.

The thick tensile film 1005 may be comprised of, for example, $Si_3N_4$. The thick tensile film may also be, for example, $Si_xN_y$, and/or silicon oxynitride $Si_xON_y$. The film 1005 may be blanket deposited over the entire surface of the substrate 100 in a conventional manner, such as by CVD, plasma enhanced CVD or PVD. In one implementation, the thick tensile film may have a thickness between 50 to 300 nanometers. The thick tensile film 1005 may exhibit a tensile stress of approximately 600 to 1500 MPa (Mega-pascals). The film 1005 is thus configured to impart a tensile stress to underlying areas.

Figure 11:
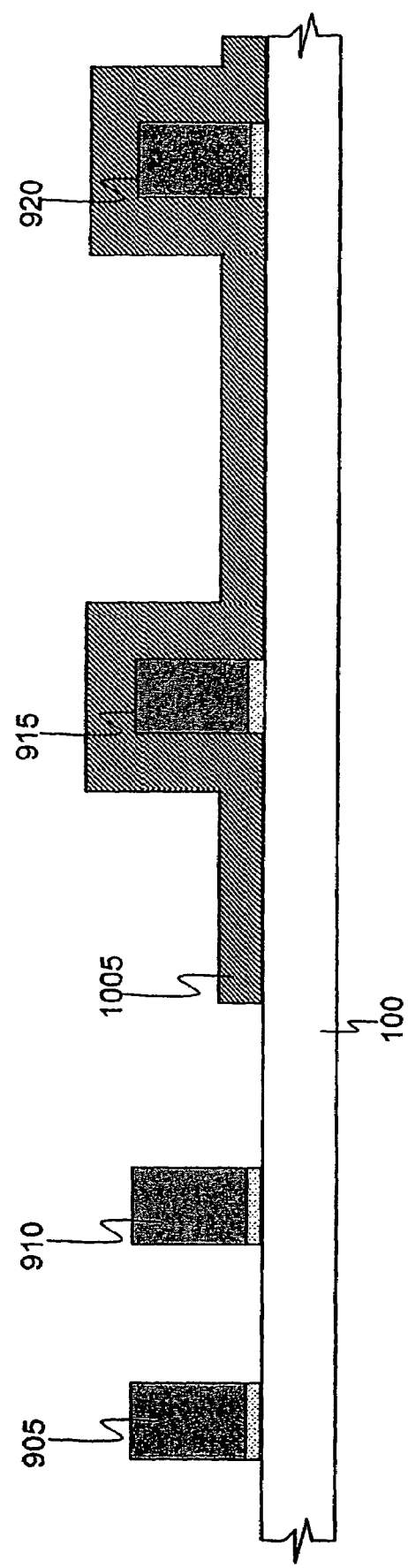
FIG. 11 shows the thick tensile stress layer removed from all areas except the group of distantly spaced nFETs.

Next, the thick tensile film 1005 is masked on locations where the isolated nFETs 915, 920 are present, to allow removal from all other areas of the substrate 100. For example, the desired pattern of nFETs 915, 920 may be transferred to an optical mask in a conventional manner. The surface of the substrate 100 may then be covered with photoresist. The resist may then be exposed through the mask to radiation that changes its structure, polymerizing (i.e., cross linking) determined areas. Unpolymerized regions may then be removed using a solvent, leaving the polymerized portions in tact. Subsequent process steps (e.g., etching) will affect only the areas without polymerized photoresist. Thus, the thick tensile film 1005 may be removed by etching (e.g., by reactive ion etching using the patterned photoresist as a mask) from all areas (e.g., 905, 910) except where the patterned nFETs 915, 920 are present, as shown in FIG. 11. Subsequently, the polymerized photoresist may be removed using a wet process, such as sulfuric acid, or a dry process, such as $O_2$ plasma.

Subsequently, another oxide liner layer (not shown) may be deposited over the top surface of the entire device to serve as an etch stop, before the next stress layer is applied, as discussed below. The oxide liner guards against unintended etching of elements beneath it, including thick tensile stress layer 1005. Alternatively, a timed etch, such as a timed dry etch, may be used to remove only the next layer from those areas of the substrate 100 that do not benefit from the stress imparted by the next layer.

Figure 12:
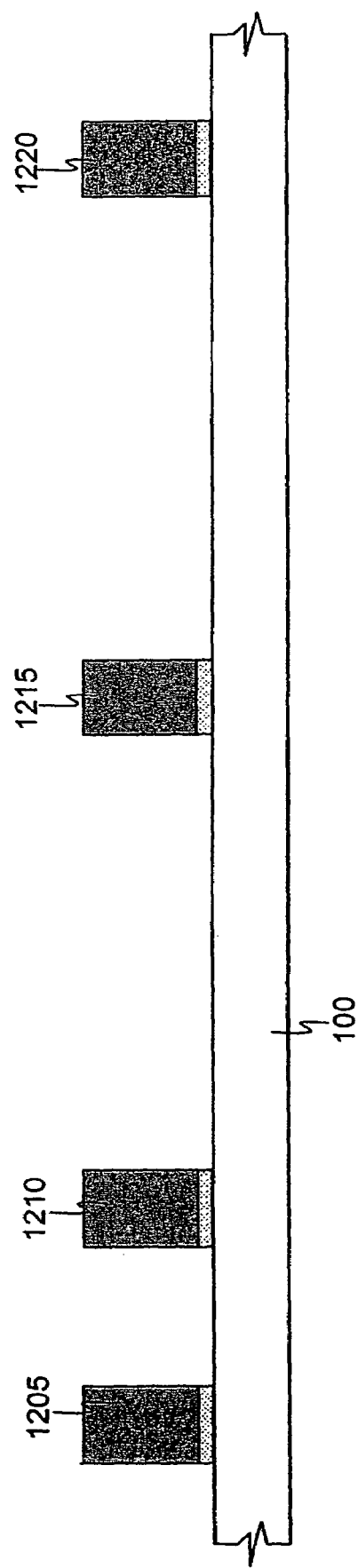
FIG. 12 shows a plurality of FETs, including a group of distantly spaced pFETs, on a semiconductor device.
Figure 13:
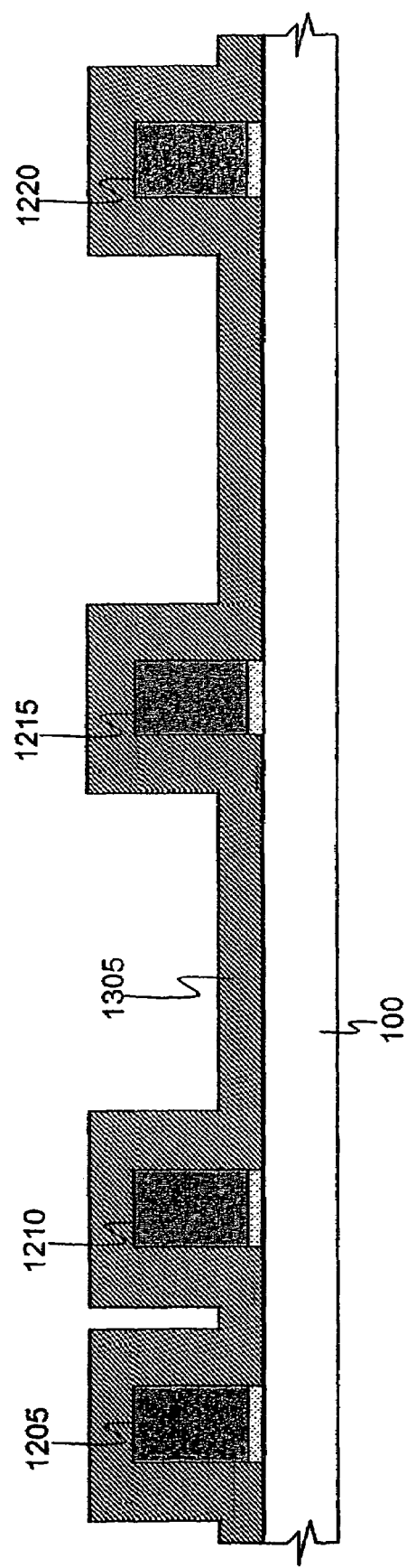
FIG. 13 shows a thick compressive stress layer applied to the plurality of FETs from FIG. 12, including the group of distantly spaced pFETs.

Referring now to FIG. 12, a sparsely populated group of (i.e., a group of distantly spaced) pFETs 1215, 1220 and a dense group of pFETs 1205, 1210 are shown. The distantly spaced pFETs may have spacings of greater than 130 nanometers, while the closely spaced FETs 1205, 1210 may have spacings of less than 130 nanometers. To impart a compressive stress to the pFETs 1215, 1220, particularly the channel region of the pFETs 1215, 1220, in accordance with the principles of the invention, a compressive stress layer 1305 is applied to the surface of the entire substrate 100, as shown in FIG. 13. Because the pFETs 1215, 1220 are separated by a relatively substantial distance, a thick stress layer 1305 of about 50 to 500 nanometers in thickness may be applied without substantial risk of void formation.

The thick compressive film 1305 may be comprised of, for example, $Si_3N_4$. The thick compressive film may also be, for example, $Si_xN_y$, and/or silicon oxynitride $Si_xON_y$. The film 1305 may be blanket deposited over the entire surface of the substrate 100 in a conventional manner, such as by CVD, plasma enhanced CVD or PVD. In one implementation, the thick compressive film may have a thickness between 50 to 300 nanometers. The thick compressive film 1305 may exhibit a compressive stress of approximately −600 to −1500 MPa (Mega-pascals). The film 1305 is thus configured to impart a compressive stress to underlying areas.

Figure 14:
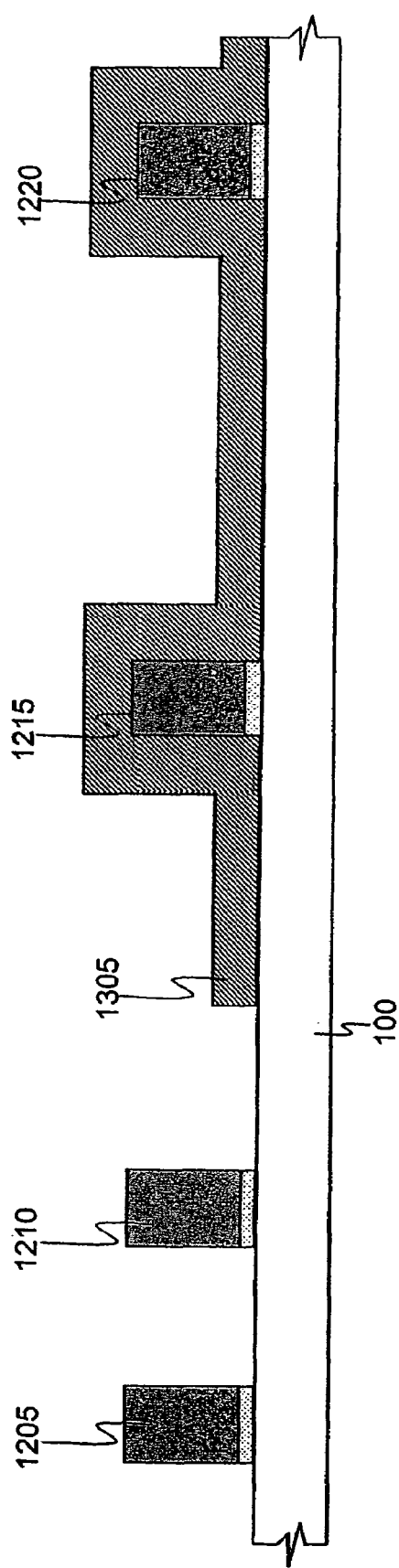
FIG. 14 shows the thick compressive stress layer removed from all areas except the group of distantly spaced pFETs.

Next, the thick compressive film 1305 is masked on locations where the isolated pFETs 1215, 1220 are present, to allow removal from all other areas (e.g., 1205, 1210) of the substrate 100. For example, the desired pattern of pFETs 1215, 1220 may be transferred to an optical mask in a conventional manner. The surface of the substrate 100 may then be covered with photoresist. The resist may then be exposed through the mask to radiation that changes its structure, polymerizing (i.e., cross linking) determined areas. Unpolymerized regions may then be removed using a solvent, leaving the polymerized portions in tact. Subsequent process steps (e.g., etching) will affect only the areas without polymerized photoresist. Thus, the thick compressive film 1305 may be removed by etching from all areas except where the patterned pFETs 1215, 1220 are present, as shown in FIG. 14. Subsequently, the polymerized photoresist may be removed using a wet process, such as sulfuric acid, or a dry process, such as $O_2$ plasma.

The order of applying the various stress layers is not critical. Compressive layers may be applied before or after tensile layers. Thick layers may be applied before or after thin layers.

In an alternative implementation, thick layers may be reduced via timed etching to produce thin stress layers over a densely populated areas. Thus, for example, a thick compressive layer may be applied for all pFETs. The compressive layer may then be removed from all areas that do not benefit from compressive stress such as, for example, areas populated with nFETs. Such removal may be carried out in the manner described above. In areas densely populated with pFETs, the compressive layer may be reduced in thickness through a wet or dry timed etch. The reduced thickness may be, for example, 20 to 50 nanometers. Isolated pFET areas may be protected with a photoresist or etch stop to avoid undesired removal and thinning of the compressive layer.

In another alternative implementation, thin compressive layers may be applied and built-up in successive layers to achieve desired thicknesses. Thus, for example, a thin tensile layer of approximately 20 to 50 nanometers may be applied for all nFETs. Subsequently, one or more additional thin tensile layers, each of approximately 20 to 50 nanometers, may be applied for isolated nFETs. The additional thin tensile layers may be removed from all areas that would be susceptible to void formation or that do not benefit from tensile stress, such as areas populated by pFETs. Such removal may be carried out in the manner described above.

While the invention has been described in terms of exemplary embodiments, those skilled in the art will recognize that the invention can be practiced with modifications and in the spirit and scope of the appended claims.

What is claimed:

1. A semiconductor structure formed on a sustrate comprising:
   a plurality of field effect transitors having a first portion of field effect transitors (FETS) and a second portion of field effect transitors;
   a first stress layer having a first thickness and being configured to impart a first determined stress to the first portion of the plurality of field effect transistors; and
   a second stress layer having a second thickness and being configured to impart a second determined stress to the second portion of the plurality of field effect transistors,
   wherein the first thickness is different than the second thickness and the first portion of field effect transitors has a different spacing or density than the second portion of field effect transitors.

2. The semiconductor structure according to claim 1, wherein:
   the first portion of the plurality of field effect transitors have spacing between adjacent field effect transitors that fall within a first defined spacing range; and
   the second portion of the plurality of field effect transitors have spacings between adjacent field effect transitors that fall within a second defined spacing range.

3. The semiconductor structure according to claim 1, wherein:
   the first defined spacing range is less than the second defined spacing range; and
   the first thickness is less than the second thickness.

4. The semiconductor structure according to claim 3, wherein the first thickness does not pose a substantial risk to void formation in the first stress layer.

5. The semiconductor structure according to claim 2, wherein:
   the first determined stress enhances performance of the first portion of the plurality of field effect transistors, without materially degrading performance of any of the plurality of FETs that are not in the first portion; and
   the second determined stress enhances performance of the second portion of the plurality of field effect transistors, without materially degrading performance of any of the plurality of FETs that are not in the second portion.

6. The semiconductor structure according to claim 5, wherein:
   the first portion of the plurality of field effect transistors is comprised of n-channel field effect transistors;
   the first determined stress is a tensile stress;
   the second portion of the plurality of field effect transistors is comprised of p-channel field effect transistors; and
   the second determined stress is a compressive stress.

7. The semiconductor structure according to claim 6, wherein:
   the first stress layer is formed by a chemical vapor deposition process using a temperature of about 480° C., a pressure of about 6.25 Torr, a spacing between the semiconductor structure and CVD electrode of about 490 mils, a flow of about 300 scm of 2% dilate $SiH_4$ gas, about 15 sccm $NH_3$ gas and about 1060 sccm $N_2$ gas using RF power of about 340 watts.

8. The semiconductor structure according to claim 6, wherein:
   the second stress layer is formed by a chemical vapor deposition process using a temperature of about 480°, a pressure of about 5.75 Torr, a spacing between the semiconductor structure and CVD electrode of about 395 mils, a flow of about 3000 sccm of 2% dilute $SiH_4$ gas, about 15 sccm of $NH_3$ gas and 1060 sccm of $N_2$ gas using RF power of 900 watts.

9. The semiconductor structure according to claim 5, wherein:
   the first portion of the plurality of field effect transistors is comprised of n-channel field effect transistors;
   the first determined stress is a tensile stress;
   the first defined spacing range is less than the second defined spacing range; and
   the second portion of the plurality of field effect transistors is comprised of n-channel field effect transistors;
   the second determined stress is a tensile stress;
   the first thickness is less than the second thickness; and
   the first thickness does not pose a substantial risk of void formation in the first stress layer.

10. The semiconductor structure according to claim 5, wherein:
    the first portion of the plurality of field effect transistors is comprised of p-channel field effect transistors;
    the first determined stress is a compressive stress;
    the first defined spacing range is less than the second defined spacing range; and
    the second portion of the plurality of field effect transistors is comprised of p-channel field effect transistors;
    the second determined stress is a compressive stress;
    the first thickness is less than the second thickness; and
    the first thickness does not pose a substantial risk of void formation in the first stress layer.

11. A semiconductor structure formed on a substrate comprising:
    a first plurality of n-channel field effect transistors having spacings between adjacent n-channel field effect transistors that fall within a first defined spacing range;
    a second plurality of n-channel field effect transistors having spacings between adjacent n-channel field effect transistors that fall within a second defined spacing range;

a first plurality of p-channel field effect transistors having spacings between adjacent p-channel field effect transistors that fall within a third defined spacing range;

a second plurality of p-channel field effect transistors having spacings between adjacent p-channel field effect transistors that fall within a fourth defined spacing range;

a first tensile layer having a first tensile layer thickness and being configured to impart a first determined tensile stress to the first plurality of n-channel field effect transistors;

a second tensile layer having a second tensile layer thickness and being configured to impart a second determined tensile stress to the second plurality of n-channel field effect transistors;

a first compressive layer having a first compressive layer thickness and being configured to impart a first determined compressive stress to the first plurality of p-channel field effect transistors; and a second compressive layer having a second compressive layer thickness and being configured to impart a second determined compressive stress to the second plurality of p-channel field effect transistors.

12. The semiconductor structure according to claim 11, wherein each of the first tensile layer; second tensile layer; first compressive layer and second compressive layer is deposited on an $SiO_2$ liner.

13. The semiconductor structure according to claim 11, wherein:
the first defined spacing range is less than the second defined spacing range; and
the third defined spacing range is less than the fourth defined spacing range.

14. The semiconductor structure according to claim 13, wherein:
the first tensile layer thickness is less than the second tensile layer thickness; and
the first compressive layer thickness is less than the second compressive layer thickness.

15. The semiconductor structure according to claim 14, wherein:
the first tensile layer thickness does not pose a substantial risk of void formation in the first tensile layer; and
the first compressive layer thickness does not pose a substantial risk of void formation in the first compressive layer.

16. The semiconductor structure according to claim 15, wherein:
the first determined tensile stress enhances electron mobility in the first plurality of n-channel field effect transistors, without materially degrading performance of the first plurality of p-channel field effect transistors and the second plurality of p-channel field effect transistors; and
the first determined compressive stress enhances hole mobility in the first plurality of p-channel field effect transistors, without materially degrading performance of the first plurality of n-channel field effect transistors and the second plurality of n-channel field effect transistors.

17. The semiconductor structure according to claim 16, wherein:
the first tensile layer thickness is proportional to the first determined spacing range;
the second tensile layer thickness is proportional to the second determined spacing range;
the first compressive layer thickness is proportional to the third determined spacing range; and
the second compressive layer thickness is proportional to the fourth determined spacing range.

18. The semiconductor structure according to claim 16, wherein the first tensile layer, second tensile layer, first compressive layer and second compressive layer, are comprised of materials from the group consisting of silicon nitride and silicon oxynitride.

19. The semiconductor structure according to claim 16, wherein:
the first tensile layer and second tensile layer each exhibit a tensile stress of about 600 to 1500 MPa; and
the first compressive layer and second compressive layer each exhibit a compressive stress of about −600 to −1500 MPa.

20. A process of forming a semiconductor structure, comprising:
forming a plurality of field effect transistors on a semiconductor substrate, the plurality of field effect transistors including a first portion of field effect transistors and a second portion of field effect transistors;
depositing a first stress layer having a first thickness and being configured to impart a first determined stress to the first portion of the plurality of field effect transistors; and
depositing a second stress layer having a second thickness and being configured to impart a second determined stress to the second portion of the plurality of field effect transistors,
wherein the first thickness is different than the second thickness and the first portion of field effect transistors has a different spacing or density than the second portion of field effect transistors.

21. A process of forming a semiconductor structure according to claim 20, further comprising:
removing portions of the first stress layer from areas of the semiconductor that would not experience performance enhancement due to the first determined stress; and
removing portions of the second stress layer from areas of the semiconductor that would not experience performance enhancement due to the second determined stress.

22. A process of forming a semiconductor structure according to claim 21, wherein the first thickness is less than the second thickness.

23. A semiconductor circuit comprising a substrate;
a plurality of field effect transistors formed on the substrate, the plurality of field effect transistors including a first portion of field effect transistors and a second portion of field effect transistors;
a first stress layer having a first thickness and being configured to impart a first determined stress to the first portion of the plurality of field effect transistors;
a second stress layer having a second thickness and being configured to impart a second determined stress to the second portion of the plurality of field effect transistors.
the first portion of the plurality of field effect transistors have spacings between adjacent field effect transistors that fall within a first defined spacing range; and
the second portion of the plurality of field effect transistors have spacings between adjacent field effect transistors that fall within a second defined spacing range,
wherein:
the first defined spacing range is less than the second defined spacing range; and
the first thickness is less than the second thickness.

* * * * *